United States Patent
Zacharias

(10) Patent No.: US 7,220,609 B2
(45) Date of Patent: May 22, 2007

(54) METHOD OF MANUFACTURING A SEMICONDUCTOR STRUCTURE COMPRISING CLUSTERS AND/OR NANOCRYSTAL OF SILICON AND A SEMICONDUCTOR STRUCTURE OF THIS KIND

(75) Inventor: Margit Zacharias, Halle (DE)

(73) Assignee: Max-Planck-Gesellschaft zur Forderung der Wissenschaften E.V., Munich (DE)

( * ) Notice: Subject to any disclaimer, the term of this patent is extended or adjusted under 35 U.S.C. 154(b) by 30 days.

(21) Appl. No.: 10/470,891

(22) PCT Filed: Jan. 28, 2002

(86) PCT No.: PCT/EP02/00860

§ 371 (c)(1),
(2), (4) Date: Feb. 3, 2004

(87) PCT Pub. No.: WO02/061815

PCT Pub. Date: Aug. 8, 2002

(65) Prior Publication Data

US 2004/0106285 A1 Jun. 3, 2004

(30) Foreign Application Priority Data

Jan. 31, 2001 (DE) ................. 101 04 193

(51) Int. Cl.
*H01L 21/00* (2006.01)
(52) U.S. Cl. ............... 438/29; 438/57; 977/731; 977/814; 977/932
(58) Field of Classification Search ............ 438/29, 438/57
See application file for complete search history.

(56) References Cited

U.S. PATENT DOCUMENTS

| 5,354,707 A | 10/1994 | Chapple-Sokol et al. ... 437/106 |
| 6,060,743 A | 5/2000 | Sugiyama et al. .......... 257/321 |

(Continued)

FOREIGN PATENT DOCUMENTS

DE 101 04 193.4 11/2001

(Continued)

OTHER PUBLICATIONS

Yun, et al: Study of Structural and Optical Properties of Nanocrystalline Silicon Embedded in SiO2. In: Thin Solid Films 375 (2000) pp. 137-141.

(Continued)

*Primary Examiner*—Asok Kumar Sarkar
(74) *Attorney, Agent, or Firm*—Sierra Patent Group, Ltd.

(57) ABSTRACT

A method for manufacturing a semiconductor structure comprising clusters and/or nanocrystals of silicon described which are present in distributed form in a matrix of silicon compound. The method comprises the steps of depositing a layer of thermally nonstable silicon compound having a layer thickness in the range between 0.5 nm and 20 nm especially between 1 nm and 10 nm and in particular between 1 nm and 7 nm on a support and thermal treatment at a temperature sufficient to carry out a phase separation to obtain clusters or nanocrystals of silicon in a matrix of thermally stable silicon compound. The claims also cover semiconductor structures having such distributed clusters or nanocrystals of silicon The method described enables the economic production of high density arrays of silicon clusters or nanocrystals with a narrow size distribution.

28 Claims, 4 Drawing Sheets

U.S. PATENT DOCUMENTS 6,157,047 A * 12/2000 Fujita et al. .................. 257/51
6,300,193 B1 10/2001 Forbes ...................... 438/257

FOREIGN PATENT DOCUMENTS

EP 0853334 A1 7/1998
WO PCT/EP02/00860 7/2002

OTHER PUBLICATIONS

Yun, et al: Room Temperature Single-Electron Narrow-Channel Memory with Silicon Nanodots Embedded in SiO2 Matrix. In: Jpn. J. Appl. Phys., vol. 39, 2000, pp. L792-L795, whole document.

Zhu, et al: Green/Blue Light Emission and Chemical Feature of Nanocrystalline Silicon Embedded in Silicon—Oxide Thin Film. In: Appl. Phys. A65, 1997, pp. 195-198, whole document.

Fujii, et al: Photoluminescence from SiO2 Films Containing Si Nanocrystals and Er: Effects of Nanocrystalline Size on the Photoluminescence Efficiency of Er3+. In: Journal of Applied Physics, vol. 84, No. 8, Oct. 15, 1998, pp. 4525-4531, whole document.

Inokuma, et al: Optical Properties of Si Clusters and Si Nanocrystallites in High-Temperature Annealed SiOx Films. In: Journal of Applied Physics, vol. 83, No. 4, Feb. 15, 1998, pp. 2228-2234, whole doc.

Tsybeskov, et al: Nanocrystalline-silicon Superlattice Produced by Controlled Recrystallization. In: Appl. Phys. Lett. 72(1), Jan. 5, 1998, pp. 43-45.

AN 2000:6674843 INSPEC, Exciton-erbium Interactions in Si Nanocrystal-Doped SiO2; Kik, et al. (FOM Inst. For Atomic & Molecular Phys., Amsterdam, Netherlands) Jour. Of Appl. Phys. (Aug. 15, 2000) vol. 88, No. 4, p. 1992-8.

AN 2000:6647662 INSPEC, Photoluminescence Decay Dynamics of SiO2 Films Containing Si Nanocrystals and Er.; Watanabe, et al. Journal of Luminescence (May 2000) vol. 87-89, p. 426-8.

AN 2000:6596447 INSPEC, Structural and Electrical Characterization of Nanocrystalline Silicon Superlattices; Tsybeskov, et al.; Proceedings of the Fifth Int'l. Symposium on Quantum Confinement: Nanostructures; Electrochem. Soc, 1999. p. 76-93 of xi+690 pp.

AN 2000:6594030 INSPEC, Quantum Confinement and Recombination Dynamics in Silicon Nanocrystals Embedded in Si/SiO2 Superlattices; Vinciguerra, et al.; Journal of Appl. Phys. (Jun. 1, 2000) vol. 87, No. 11, p. 8165-73.

AN 2000:6496282 INSPEC, Production of Silicon Nanocrystals by Thermal Annealing of Silicon—Oxygen and Silicon—Oxygen—Carbon Alloys: Model Systems for Chemical and Structural Relaxation at Si—SiO2 and SiC—SiO2 Interfaces; Lucovsky, et al.; Microcrystalline and Nanocrystalline Semiconductors—1998 Warrendale, PA, USA:Mater. Res. Soc, 1999.p. 111-16 of xiv+569 pp. 14.

AN 1998:5989007 INSPEC, Nanocrystalline Silicon Superlattices:Fabrication and Characterization; Zacharias, et al.; Journal of Non-Crystalline Solids (May 1998) vol. 227-230, pt.B, p. 1132-6.

AN 1998:5988878 INSPEC, Study of SiOx Decomposition Kinetics and Formation of Si Nanocrystals in an SiO2 Matrix; Hinds, et al.; Journal of Non-Crystalline Solids (May 1998) vol. 227-230, pt.A, p. 507-12.

AN 1998:5815642 INSPEC, Preparation and Characterization of Silicon Nanocrystals in a SiO2 Matrix and Study of Suboxide Stability; Hinds, et al.; Advances in Microcrystalline Semiconductors—1996. Mater. Res. Soc, 1997. p. 207-12 of xxv+1060 pp. 30.

AN 1998:5788430 INSPEC, Raman Spectroscopy Investigation of Silicon Nanocrystals Formation in Silicon Nitride Films; Volodin, et al.; Diffusion and Defect Data Part B (Solid State Phenomena) (1997) vol. 57-58, p. 501-6. 4 refs.

Database INSPEC online!Institute of Electrical Engineers, Stevenage, GB; Yu Liang, et al: The Mechanism of Formation and Photoluminescence of Si Quantum Dots Embedded in Amorphous Si0/Sub 2/Matrix; vo. 4086, pp. 174-177, Proceedings of the SPIE—The International Society for Optical Engineering, 2000, SPIE—Int. Soc. Opt. Eng, USA.

Eckstein, et al.: Modeling of the Formation and Properties of nanocrystals in Insulator Matrices (SiO2:Si,Zro2(Y):ZR) Produced by Ion Implantation; Sep. 17, 2000 pp. 757-760, XP001069072 p. 757-758.

Zacharias, et al.: Crystallization of Amorphous Superlattices in the Limit of Ultrathin Films with Oxide interfaces, The American Physical Society, vol. 62, No. 12, Sep. 15, 2000, pp. 8391-8396.

Canham, L.: Gaining Light From Silicon, Nature, vol. 408, Nov. 23, 2000, pp. 411-412.

Pavesl, et al.: Optical Gain in Silicon Nanocrystals, Nature, vol. 408, Nov. 23, 2000, pp. 440-444.

* cited by examiner

METHOD OF MANUFACTURING A SEMICONDUCTOR STRUCTURE COMPRISING CLUSTERS AND/OR NANOCRYSTAL OF SILICON AND A SEMICONDUCTOR STRUCTURE OF THIS KIND

CROSS-REFERENCE TO RELATED APPLICATIONS

This application claims filing date priority benefit to German application No. 101 04 193.4, filed Jan. 31, 2001, and to PCT application No. PCT/EP02/00860, filed Jan. 28, 2002, under 35 U.S.C. 119 which is explicitly incorporated by reference as if set forth below.

BACKGROUND OF THE INVENTION

1. Field of the Invention

The present invention relates to a method of manufacturing a semiconductor structure comprising clusters and/or nanocrystals of silicon which are present in distributed form and a matrix of a silicon compound and to a semiconductor structure of this kind.

2. Statement of the Prior Art

It is known that Si clusters or nanocrystals embedded in $SiO_2$ show a strong visible luminescence.

There is currently much interest in designing semiconductor structures based on silicon which are able to emit light and which are suitable for integration into optoelectronic circuits in chip form, for example in the form of lasers and high speed telecommunication devices, and for use in memories.

The Nov. 23, 2000 issue of Nature, Volume 408 includes on pages 411 and 412 a general article by Leigh Canham giving a general overview of the concept of obtaining light from silicon with particular reference to silicon nanocrystals. The same edition of nature also contains, on pages 440 to 444 an article by L. Pavesi and colleagues entitled "Optical Gain in Silicon Nanocrystals".

A general discussion of the physics of crystallization of amorphous superlattices in the limit of ultra thin films with oxide interfaces is given in an article by M. Zacharias and P. Streitenberger in Physical Review B, Volume 62, No. 12 of Sep. 15, 2000 on pages 8391 to 8396.

At this stage it should be explained that silicon nanocrystals are crystals of silicon with dimensions in the nanometer (nm) range. The nanocrystals contain relatively few silicon atoms and have properties which differ from those of larger silicon crystals. Accumulations of silicon atoms without crystallization are sometimes also referred to as clusters.

To date there have been two principal proposals for the generation of such silicon clusters or nanocrystals. The first proposal is, e.g., described in the article by L. Pavesi et al in the named issue of Nature. This article describes how silicon ions have been implanted by negative ion implantation techniques into ultra-pure quartz substrates or into thermally grown silicon dioxide layers on Si substrates followed by high temperature thermal annealing, for example at 1100° C. for one hour. This heat treatment allows the implanted silicon atoms to move within the substrate and form Si clusters or nanocrystals during the high temperature thermal annealing. In the cited article by Pavesi et al, it is stated that the silicon nanocrystals embedded within silicon dioxide matrix are of the order of 3 nm in diameter in concentration of $2\times10^{19}$ $cm^{-3}$.

A similar process of forming Si nanocrystals by ion implantation is described in an article by W. Eckstein and colleagues entitled "Modeling of the Formation and Properties of Nanocrystals in Insulator Matrices ($SiO_2$:Si, $ZrO_2$(Y):Zr) Produced by Ion Implantation" which has been published in the Proceedings of the International Conference on Ion Implantation Technology, 17–22 September 2000, pages 757–760.

Although ion implantation can be used to produce silicon nanocrystals it has the significant disadvantage that large area ion implantation with a high Si ion dose is not regularly used in silicon electronic production systems and thus the need to use ion implantation is a substantial complication of the manufacturing process.

A second proposal for the manufacture of silicon nanocrystals is to be found in U.S. Pat. No. 6,060,743. This U.S. patent describes a variety of semiconductor structures all of which basically involve the deposition of a thin amorphous silicon layer on a silicon dioxide film. The amorphous silicon layer is for example just 1 nm thick. The thin silicon film is deposited at a relatively low temperature and is subsequently heated to about 800° C. without being exposed to the atmosphere (in order to prevent oxidation). The heating caused an agglomeration phenomenon in the flat amorphous silicon layer formed on a silicon oxide film. As a result, the amorphous silicon layer is converted into independent crystals of about 10 nm in diameter at most and about 5 nm in height with a density of the silicon nanocrystals of $3.5\times10^{11}$ $cm^{-3}$. The silicon nanocrystals are formed on the silicon dioxide film of the silicon substrate. Thereafter a further silicon dioxide film is deposited over the substrate and the nanocrystals.

A similar process of forming Si clusters in amorphous $SiO_2$ is described in an article by Y. Liang and colleagues entitled "The Mechanism of Formation and Photoluminescence of Si Quantum Dots Embedded in Amorphous $SiO_2$ Matrix" which has been published in the Proceedings of the Fourth International Conference on Thin Film Physics and Applications, Shanghai, China, 8–11 May 2000, vol. 4086, pages 174–177.

This method has the disadvantage that only a relatively small density of nanocrystals can be achieved and that the method can only be rationally extended to the production of a few "layers" of nanocrystals because of the process that is used.

SUMMARY OF THE INVENTION

The object underlying the present invention is to provide a method for the manufacture of clusters and/or nanocrystals of silicon which enables a semiconductor structure having a high density of clusters and/or nanocrystals to be achieved with the clusters and/or nanocrystals having a narrow size distribution, i.e. a well defined average size and spacing, with the method being fully compatible with existing silicon technology and being capable of being carried out economically on a large scale and on full size silicon wafers.

In order to satisfy this object there is provided, in accordance with the present invention, a method of the initially named kind which is characterized by the steps of:

depositing a layer of a thermally non-stable silicon compound having a layer thickness in the range between 0.5 nm and 20 nm especially between 1 nm and 10 nm and in particular between 2 nm and 7 nm on a support and thermally treating the layer at a temperature sufficient to carry out a phase separation to obtain the clusters or nanocrystals of silicon in a matrix of thermally stable silicon compound, wherein the size and size distribution of the clusters and/or nanocrystals of silicon as well as their density in said layer of silicon compound and the mean spacing between adjacent clusters and/or nanocrystals of silicon is controlled by adjusting the thickness and composition of said layer of silicon compound and wherein the clusters or nanocrystals are substantially coplanar.

This method is best explained with reference to an example. First it is necessary to have available a suitable support substrate which can be a silicon wafer with a silicon dioxide film on one of its surfaces, or a quartz wafer, i.e. a wafer of silicon dioxide, or any other thermally stable support which is capable of withstanding the relatively high temperatures which are required for the thermal treatment, which typically lie in the range between 800 and 1100° C. A further example of such a support is sapphire. A layer of a thermally non-stable silicon compound, for example in the form of $SiO_x$ with $0<X<2$, is then deposited as an amorphous layer onto the support and the thickness of the amorphous layer is controlled to lie in the range between 0.5 nm and 20 nm, with a layer thickness in a range from 1 nm to 10 nm being preferred and with the range between 1 nm and 7 nm being best suited for the realization of the invention.

This thermally non-stable silicon compound layer is subjected to a thermal treatment, for example by heating it to a temperature above the crystallization temperature of the thermally non-stable silicon compound layer or by subjecting the layer to so-called rapid thermal annealing in which it is rapidly heated up to a temperature around the crystallization temperature or even below it, then rapidly cooled down again, e.g. using the AST 10 RTP system of the Steag group. Either of these techniques can be used to produce phase separation of the deposited thermally non-stable silicon compound layer. That is to say the oxygen atoms and silicon atoms in the layer rearrange themselves into clusters or nanocrystals of pure silicon and a matrix of stochiometric silicon dioxide $SiO_2$. The thickness of the layer that is deposited defines the height of the nanocrystals that are formed, i.e. defines the upper limit for the height of the nanocrystals of silicon and also constrains the lateral dimensions of the nanocrystals. The proportion x of the thermally non-stable SiOx determines the diameters or dimensions of the silicon nanocrystals and clusters in a direction parallel to the plane of the layer and the mean spacing between adjacent silicon clusters or nanocrystals. Thus the deposited layer of thermally non-stable silicon compound is rearranged by the thermal treatment into clusters or nanocrystals of silicon distributed in a matrix of silicon dioxide. The process can readily be controlled so that a high density of silicon clusters or nanocrystals is achieved in a narrow size distribution with such clusters or nanocrystals being isolated from adjacent cluster or nanocrystals by relatively well-defined amounts of thermally stable silicon dioxide.

Because the thermally non-stable layer is deposited onto, for example, silicon dioxide there is no tendency for the silicon nanocrystals to grow onto a pure silicon surface which might otherwise inhibit the formation of unit formally sized discrete silicon clusters or nanocrystals.

In accordance with a preferred embodiment of the invention the support is provided, at least at the interface to the deposited layer, with a layer of a thermally stable silicon compound or of at least one rare earth compound. The thermally stable compound can, for example, be silicon dioxide or silicon nitride and the rare earth compound could, for example, be erbium oxide. The presence of rare earth elements close to and adjacent to the clusters or crystals of silicon has been found to enhance the luminous emission of the rare earth element and in particular leads to enhanced radiation with a wavelength of 1.54 µm (for erbium) which is a preferred wavelength for optoelectronic applications.

Although it is conceivable that a single thin layer containing distributed clusters and/or nanocrystals of silicon on a support may be sufficient for some purposes, it is considered preferable to deposit a further layer of thermally stable silicon compound or of at least one rare earth compound onto the thermally non-stable silicon compound layer prior to the thermal treatment to produce the clusters or nanocrystals. This leads to a high-density array of silicon clusters or nanocrystals in a single plane with a density of typically $1 \times 10^{13}$ cm$^{-2}$.

In particular, it is possible to provide an alternating sequence of deposited layers of thermally non-stable and thermally stable silicon compounds, optionally with further intermediate layers. Using the invention, the entire layer structure can be formed and only then subjected to the thermal treatment necessary to convert the thermally non-stable silicon compound into clusters and/or nanocrystals of silicon in a silicon dioxide matrix.

In this way a three-dimensional array of silicon clusters or microcrystals can be achieved with a density of e.g. $2 \times 10^{19}$ cm$^{-3}$ in each relevant layer.

With such an alternating sequence of deposited layers, all layers of thermally non-stable silicon compound should have the same thickness in the range given above in order to ensure that silicon clusters and/or nanocrystals of the correct size are produced. The separating layers of thermally stable silicon compound can, however, be substantially thicker.

It is also possible to realize the alternate layers of thermally stable silicon compound with sizes in an nm range so that the alternating sequence is realized as a superlattice.

The alternating sequence of layers can be formed in at least one spatially bounded region of a structure, for example of a photonic or optical structure.

The possibility also exists of then removing the material surrounding the spatially bounded region, for example by etching, to form a free standing layer sequence which can be contracted at the free upper surface for incorporation into an optoelectronic circuit, with the other contact to the free standing layer sequence being realized, for example at the support or substrate.

With such layer sequences, one or more of the silicon compound layers can be doped with at least one element or compound of the group of rare earth elements, for example by implantation or during layer generation.

The mean size and the mean spacing of the clusters or of the nanocrystals can be set by the stochiometry of the thermally non-stable compound, i.e. by the value selected for x. In addition, the mean size and mean spacing of the clusters or of the nanocrystals can be set by the temperature characteristic of the thermal treatment and also by the environmental conditions which are used, for example the gases that are used in the treatment chamber which can, for example, be forming gas, or oxygen, or argon. Alternatively, vacuum conditions can be used in the thermal treatment chamber which again can affect the mean size and spacing of the clusters and/or nanocrystals.

Further preferred embodiments of the method are set forth in the subordinate claims as are preferred embodiments of semiconductor structures formed using the method.

Some exemplary embodiments are concerned with semiconductor structures in which the thermally non-stable semiconductor compound layers have been converted into clusters and/or nanocrystals of silicon distributed in a silicon dioxide matrix, these embodiments relate to the semiconductor structure prior to the thermal treatment to produce the clusters or nanocrystals of silicon since such semiconductor structures can form intermediate products which can be traded in their own right, in the same way as that semiconductor wafers, as intermediate products for the subsequent manufacture of electronic devices and circuits.

BRIEF DESCRIPTION OF THE DRAWINGS

The invention will now be explained in more detail with reference to preferred embodiments and to the drawings in which are shown.

DETAILED DESCRIPTION OF THE INVENTION

Figure 1:
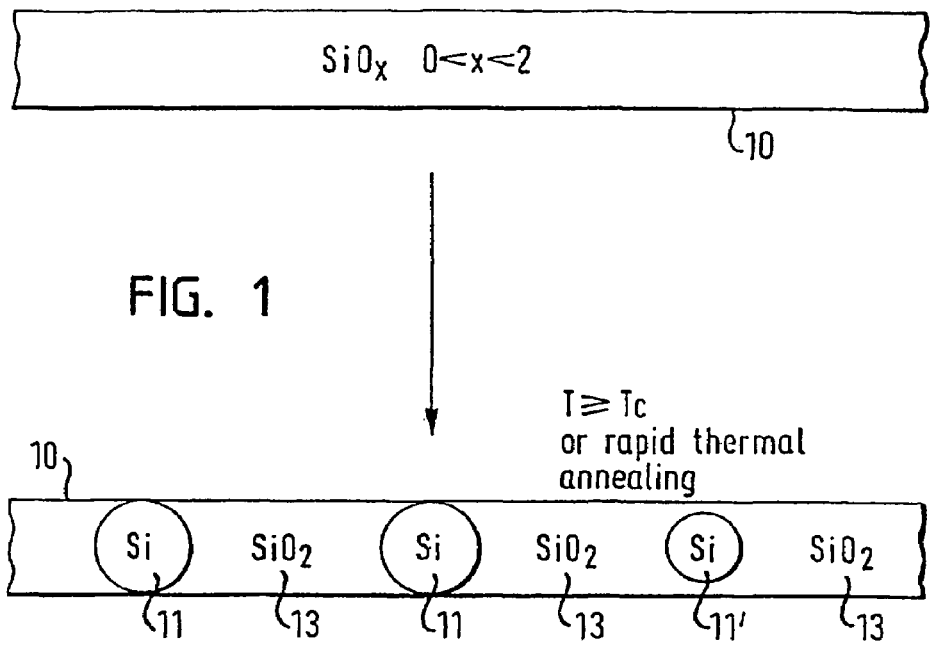
FIG. 1 a schematic diagram to illustrate the formation of silicon clusters or nanocrystals using the method of the invention, FIG. 2 a schematic diagram showing the single layer array of silicon clusters or nanocrystals formed on a support, FIG. 3 a schematic diagram similar to FIG. 2, but showing an alternative form of the support, FIG. 4 a schematic diagram similar to FIG. 3, but showing the single layer array of silicon clusters or nanocrystals covered by a capping layer of a thermally stable silicon compound, FIG. 5 a schematic diagram showing a further development of the concept of FIG. 4 to produce multilayer arrays of silicon clusters or nanocrystals, FIG. 6 a schematic diagram showing a modification of the multilayer system of FIG. 5 to form a superlattice structure incorporating silicon clusters and nanocrystals in alternate layers, FIG. 7 a perspective view of a wafer having an array of recesses therein, FIG. 8 a schematic cross-section on the plane VIII—VIII of FIG. 7 to enlarged scale and showing superlattice structures similar to FIG. 6 formed in each of the recesses of the wafer of FIG. 7, FIG. 9 a schematic diagram showing the superlattice structure of FIG. 7 incorporated into a so-called MOS structure, and FIG. 10 a schematic diagram of a known semiconductor light-emitting device adapted to use a superlattice structure in accordance with the present invention in the optically active region.

Turning now to FIG. 1 there is shown a schematic side view of a single layer 10 of a layer of a thermally non-stable silicon compound, here in the form of $SiO_x$, with the value of x selected to be a non-stochiometric value greater than 0 but less than 2. The layer 10 can have a layer thickness in the range between 0.5 nm and 20 nm, but is preferably 2 to 3 nm thick. The layer 10 can be deposited by any of the known layer deposition processes such as a chemical vapor deposition, low-pressure chemical vapor deposition, evaporation of $SiO_x$ in oxygen containing atmospheres, sputtering, reactive sputtering, pulsed laser deposition and molecular beam epitaxy.

Although the thermally non-stable silicon compound used in all the present examples is $SiO_x$, it is quite conceivable that other thermally non-stable silicon compounds can also be used, one possibility being a silicon nitride which would then be deposited in the form $SiN_x$.

Having deposited the layer 10, it is then subjected to a thermal treatment and this results in a phase separation of the amorphous $SiO_x$ into clusters or nanocrystals 11 of Si separated by a matrix of $SiO_2$ 13, as is schematically shown in the lower version of the layer 10 in FIG. 1, with the vertically downwardly directed arrow representing the heat treatment. This heat treatment can either be a heat treatment at a temperature at or above the crystallization temperature Tc for a suitable period of time, for example a heat treatment at 1100° C. for 60 minutes. It should be noted that Tc is not actually a fixed value, but depends with thin layers on the precise layer structure that is being used because the crystallization temperature is strongly dependent on strain considerations and these are affected by the layer size. Thus, the crystallization temperature can fluctuate over a wide range from the crystallization temperature of amorphous bulk material of 700° C. up to temperatures of 1100° C. or more depending on the precise layer structure involved.

It should also be noted that the maximum height of the Si clusters or nanocrystals is limited by the layer thickness. It is, however, possible for Si clusters or nanocrystals smaller than the layer thickness to form as is indicated at 11' in FIG. 1. The stochiometry, i.e. the value of x in $SiO_x$ can affect this tendency. When x is relatively high, the tendency to form smaller clusters or crystals such as 11' tends to be higher.

An alternative to thermal treatment at a substantially constant temperature for a fixed period of time is to subject the layer or layer structure to rapid thermal annealing so that the layer or layer structure involved is rapidly heated up to a peak temperature and rapidly cooled down again once or a plurality of times, with the peak temperature generally being in the range quoted above (700° C. to 1100° C.) or even significantly lower, below the crystallization temperature Tc for the structure.

Irrespective of the thermal treatment that is used, the thickness of the layer 10 will control the height as well as the lateral dimensions of the nanocrystals and will also control the size distribution of the clusters or nanocrystals in such a way that the size distribution will be very narrow. The clusters or nanocrystals of silicon that are formed are thus well defined and are separated by a good quality oxide which can be as thin as two monolayers thick. Generally speaking, the spacing surface-to-surface between adjacent clusters and silicon nanocrystals will be selected to be in the range between 0.5 nm and 20 nm.

In this way, the layer 10 contains a dense single-plane array of Si clusters or nanocrystals, with a narrow size distribution and this favors high intensity defined luminous emission from the layer when supplied with energy from an outside source, either in the form of optical pumping or through the injection of charge carriers.

Figure 2:
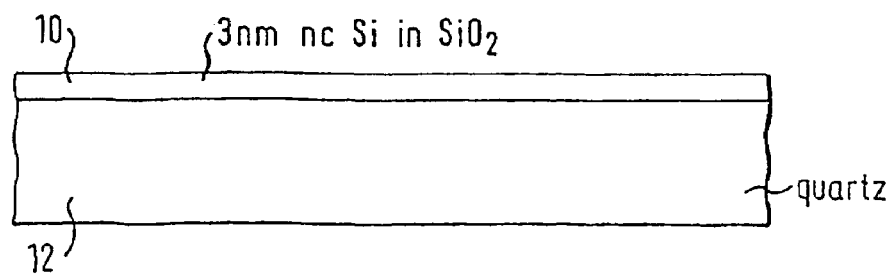
Figure 3:
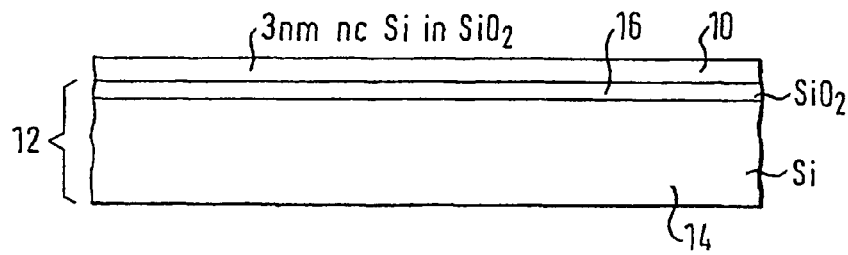

In a practical embodiment, the layer of FIG. 1 must be formed on a support 12 as shown in FIG. 2. In FIG. 2 the support 12 is formed of quartz and the layer 10 is present in the thermally treated form, i.e. corresponding to the lower diagram in FIG. 1. This layer is described here as nc Si in $SiO_2$ (nc=nanocrystal). Quartz consists chemically of $SiO_2$ which is a chemically and thermally stable compound of silicon and therefore there is no danger that the Si nanocrystals will coalesce with the surface of the support, instead they will remain in discrete form in the layer 10. Instead of using quartz for the support 12, this could also be a substrate of another thermally stable material, such as a sapphire wafer. Alternatively, as shown in FIG. 3, the support 12 can comprise a silicon substrate 14 with a layer 16 of $SiO_2$ grown on it, for example a thermally grown silicon dioxide layer obtained by exposing the silicon substrate to a high temperature in an oxygen-containing environment. The layer 10 is then deposited on the $SiO_2$ layer and the resulting semiconductor structure is treated thermally to produce the nanocrystalline silicon in $SiO_2$ in this 3 nm thick layer 10. It is noted that the $SiO_2$ layer 16 directly below the layer 10 also means the nanocrystals in the layer are separated from the Si substrate by $SiO_2$.

Figure 4:
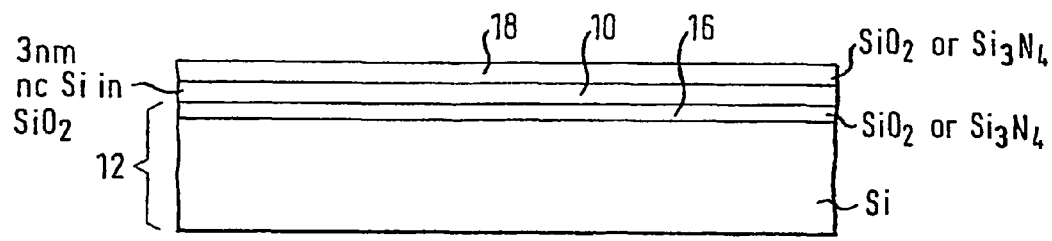

The semiconductor structure of FIG. 3 can be further developed as shown in FIG. 4 by depositing a further layer 18 of $SiO_2$. The layer 18 is preferably $SiO_2$. However, it could, for example, also be $Si_3N_4$ and this also applies to the layer 16.

It is, however, particularly simple to realize the invention when the layers 16 and 18 are $SiO_2$ and the layer 10 is deposited as $SiO_x$. When this is the case, it is possible to control the composition of the layers simply by varying the oxygen pressure in the deposition chamber. If the oxygen pressure is set relatively high, then there will be sufficient oxygen atoms present that a thermally stable $SiO_2$ is deposited. If, on the other hand, the oxygen pressure is reduced, then an SiOx layer is deposited because there are insufficient oxygen atoms available to form $SiO_2$. Thus, a layered system, such as the layers 16, 10 and 18 in FIG. 4, can be deposited simply by varying the oxygen pressure in the deposition apparatus.

Figure 5:
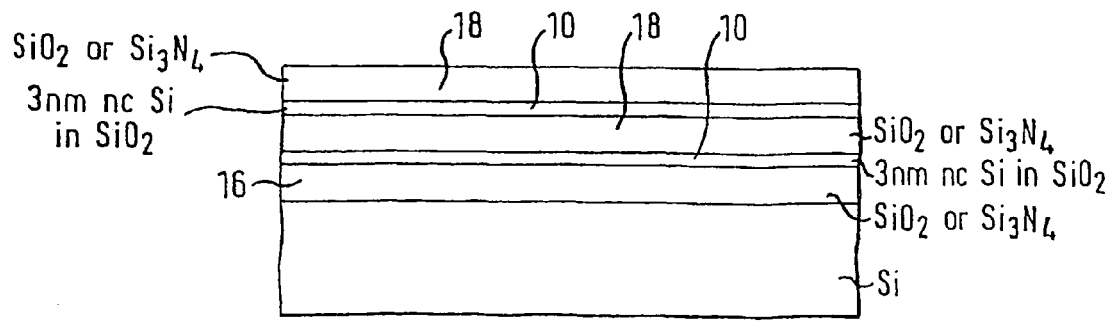

This also applies to the multilayer structure shown in FIG. 5. The structure shown in FIG. 5 differs only from the structure shown in FIG. 4 by the fact that it involves an alternating sequence of layers 10 and layers 18, with the layers 18 of $SiO_2$ or $Si_3N_4$ being substantially thicker than the equivalent layers in FIG. 4. Each layer 10 is realized as a 3 nm thick layer with nanocrystalline silicon in $SiO_2$ and therefore there is a well-ordered array of silicon clusters or nanocrystals in the semiconductor structure that is formed. Although the embodiment of FIG. 5 shows just two layers 10, the structure can be repeated with many more layers 10 and 18 as desired. This also applies to the structure shown in FIG. 6, where an alternating sequence of 25 alternate layers 10 and 18 are deposited on a support 12 which is shown here as a quartz support. The layers 10 are again realized in accordance with a preferred embodiment by a 3 nm thick layer with nanocrystalline silicon distributed in an $SiO_2$ matrix. The layers 18 are preferably formed of $SiO_2$.

It is not, however, essential for the support 12 to be a quartz substrate. The support could, for example, be a sapphire substrate or it could be a silicon substrate, in which case a layer 16 of $SiO_2$ should be deposited on the silicon substrate beneath the bottom-most layer 10 of the superlattice structure. In order to realize the superlattice structure the layers 18 should be kept relatively thin, in the nanometer range, i.e. thinner than the layers shown schematically in FIG. 5. The superlattice structure has the advantage, that the individual layers 10 of the structure are arranged relatively close to one another, so that a high density of clusters or nanocrystals of silicon is achieved and indeed the crystals are disposed in the well-ordered layers 10. The superlattice structure can again be realized by varying the oxygen pressure in the deposition system.

Figure 6:
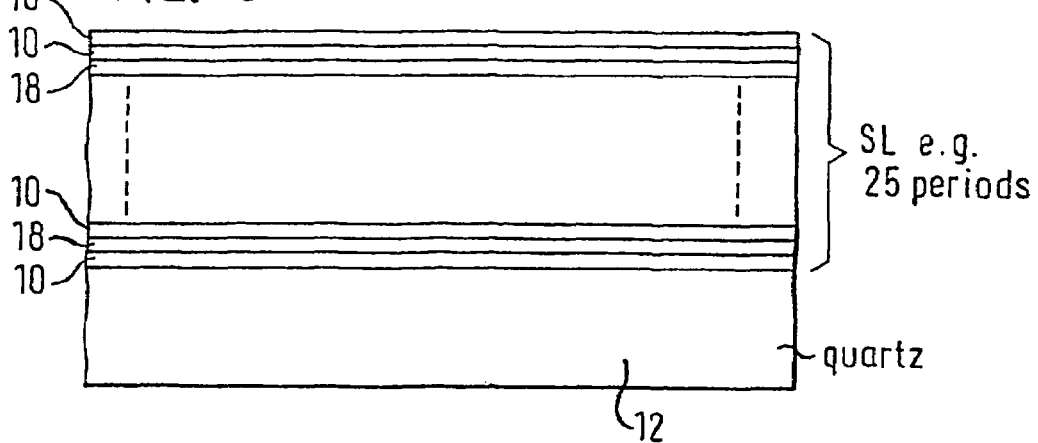
Figure 7:
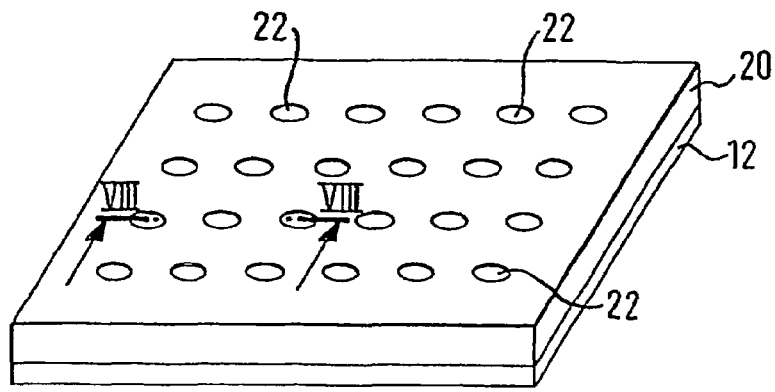
Figure 8:
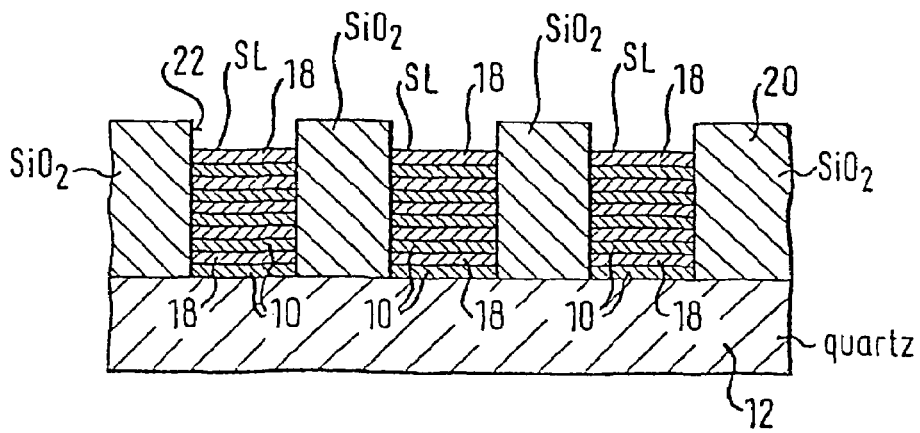

FIGS. 7 and 8 show an interesting concept for the realization of a superlattice structure as shown in FIG. 6 in a photonic, optical or electronic structure.

FIG. 7 schematically illustrates a chip or wafer comprising a support 12 of quartz on which there has first been grown a relatively thick layer 20 of silicon dioxide. The layer of silicon dioxide is then etched to form a plurality of recesses or spatially bounded regions 22 which are shown in FIG. 7 as round holes, but which could also be square holes or regions of other shape, for example channel shaped recesses. The superlattice structure is then deposited in the spatially bounded regions 22 on top of the quartz substrate resulting in a finished structure as shown schematically in FIG. 8. Again, the reference numerals used in FIG. 8 have the same meaning as in the earlier drawings. I.e. the layers 10 comprise, in the preferred embodiment, a 3 nm thick layer of nanocrystalline silicon in $SiO_2$ and the layers 18 comprise layers of $SiO_2$. Instead of using quartz as a support it is also possible to use a sapphire support or a silicon substrate, in which case a layer of silicon dioxide is first grown onto the silicon substrate to form the support, so that the bottom layer of each superlattice structure is now not a layer 10, but a layer of $SiO_2$ corresponding to the layer 16 in FIG. 4.

Alternatively, instead of using a quartz support and an $SiO_2$ layer 20 one can use a bulk silicon wafer in which holes or channels or recesses are formed, e.g. by etching.

A structure of the kind shown in FIG. 8 can be used for an optically pumped silicon device showing luminescence at a wavelength determined by the size of the nanocrystals in the silicon dioxide matrix and/or by the Si nanocrystal/$SiO_2$ interface states and/or by states defined by a rare earth element or compound used as a dopant in the structure. It is namely possible, in all the structure described herein to use at least one rare earth element or at least one compound of rare earth element as a dopant. For example, the dopant can comprise erbium or erbium oxide which results in luminescence at a wavelength of 1.54 µm. In order to achieve this luminescence, it is necessary to pump the structure either optically or electronically. In the optical case this would be done with radiation, for example broadband radiation, at a higher frequency (shorter wavelength) which is provided by the silicon nanocrystals and which stimulates the radiative transmissions of 1.54 µm wavelength.

The doping can take different forms. For example, the doping can comprise small quantities of dopant material distributed throughout the layer system. Alternatively, thin layers of dopant can be deposited adjacent the layers 10 so that a dopant is present in the proximity of the nanocrystals. Also volume doping can be used in the layers 10 so that again dopants are in close proximity to the silicon nanocrystals.

The structure of FIG. 8 can also be further developed. One possibility for this would be to apply a mask to the structure of FIG. 8 covering over the superlattice structures but exposing the $SiO_2$ material in the layer 20 surrounding the superlattice structures. Once the mask has been applied, the $SiO_2$ regions could be selectively etched away to leave free-standing superlattice pillars on the substrate. It is then conceivable that contacts could be applied to the top of the free-standing superlattice pillars and to the substrate 12 (if realized as conductive silicon, for example n-type Si) making it possible to supply charge carriers to the superlattice structure and to generate luminescence by an electrical technique.

A structure formed in this way could subsequently be split up into individual devices, each comprising one free-standing superlattice pillar and indeed the pillars could also be formed as elongate strips or bars.

Figure 9:
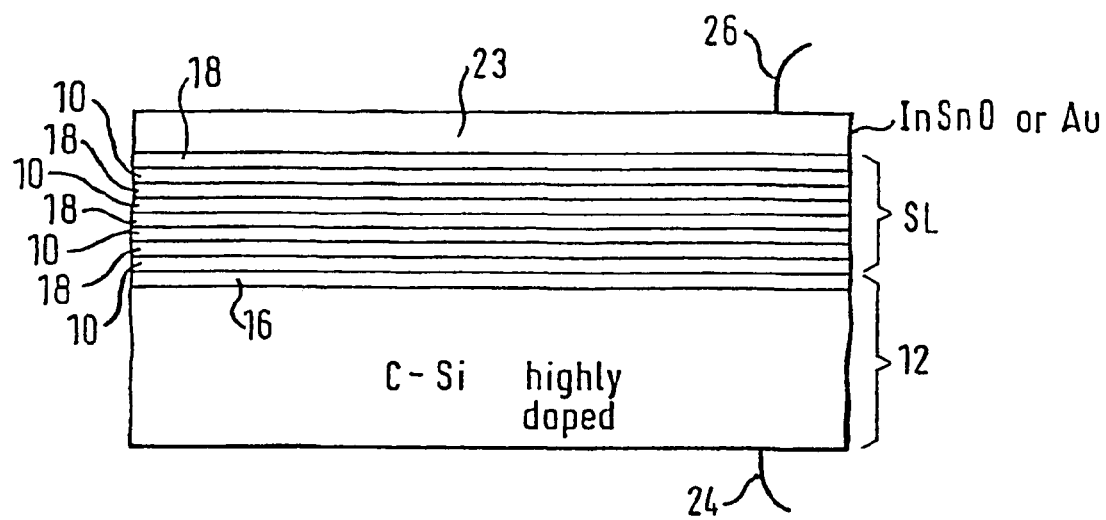

FIG. 9 shows a way of incorporating a superlattice structure similar to that shown in FIG. 6 into a so-called MOS structure. Here, the support 12 is realized as a highly doped silicon substrate (crystalline silicon substrate of n-type) on which the superlattice structure is grown, with a layer 16 of SiO$_2$ at the interface between the support 12 and the lowermost layer 10 of the superlattice structure. Again the layers 12, 16, 10 and 18 are to be understood in accordance with the description previously given for layers identified by the same reference numerals. On top of the superlattice structure and after the high temperature annealing there is then deposited a light transmitting contact layer, for example of ITO (indium tin oxide, (InSnO)) or a transparent metallic layer such as gold. Leads such as 24 and 26 can then be bonded to the contact layers at the substrate and at the top layer 23.

Although the top layer of the superlattice structure shown in FIG. 9 is identified by the reference numeral 18, the top layer beneath the contact layer could also be a layer 10. Moreover, the number of periods of the superlattice layer shown in FIG. 9 is given purely by way of illustration, the number of layers actually present could be varied at will, as in the other embodiments involving the superlattice structures.

Figure 10:
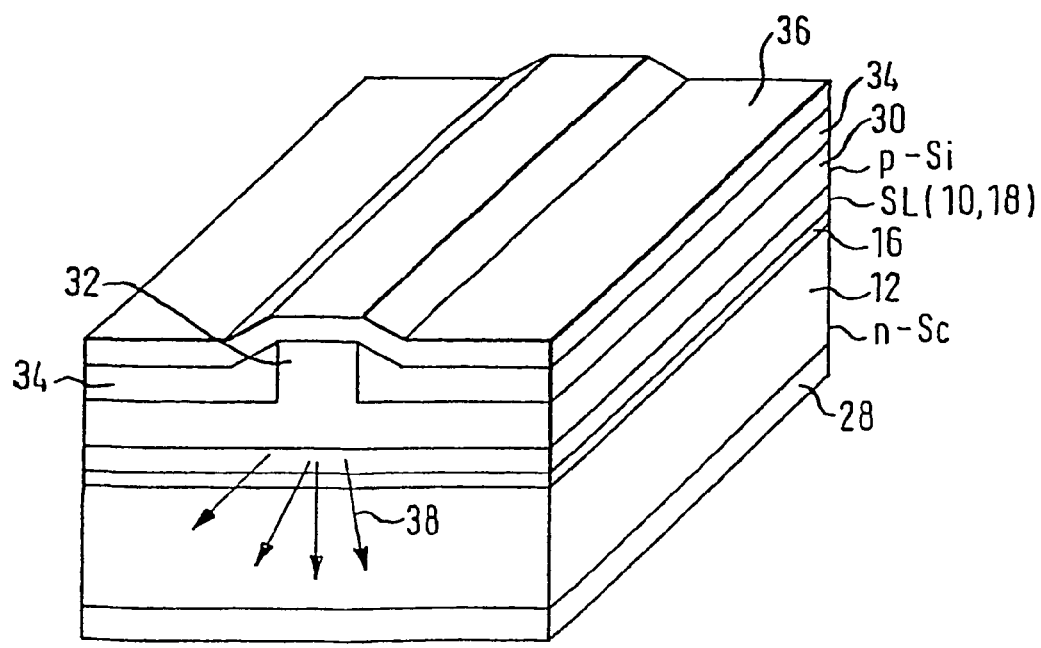

Finally, FIG. 10 shows a schematic drawing of a light-emitting device in a configuration which is generally known per se, but is in this case adapted to use the superlattice structure of the invention.

More specifically, the schematic diagram of FIG. 10 shows a structure having the following layers, starting from the bottom 0.28 nm is a contact layer provided on the bottom side of an n-type silicon support 12 on which a superlattice structure, identified here as SL (10, 18), is deposited, again with an interface layer 16 of SiO$_2$ provided between the n-Si layer and the superlattice structure 10, 18. The superlattice structure is then followed by a layer 30 of p-type Si which is extended upwardly in the central region to form a bar or stripe 32 of the same material. An insulator 34, for example SiO$_2$, is then deposited on either side of the bar 32 above the layer 30 of p-type Si and the structure is then capped by an upper contact layer 36. By applying a potential difference across the layers 28 and 36 it is then possible to supply charge carriers to the superlattice structure 10, 18 and generate luminescence there, so that light leaves the superlattice structure in the region beneath the bar 32 as illustrated by the arrows 38.

When realized using SiO$_x$ as the thermally non-stable silicon compound and SiO$_2$ as the thermally stable silicon compound, the thickness of the SiO$_x$ and SiO$_2$ layers, their number, the composition of the SiO$_x$ layers (x between 0 and 2) and the thermal treatment process (time duration, temperature, temperature profile and the gases used during thermal treatment or the vacuum used during thermal treatment) can be varied to control:

The size of the clusters or nanocrystals of silicon that are produced, the size distribution of the particles, the density of the clusters or nanocrystals within each layer containing clusters and nanocrystals, and thickness of the oxide barriers between the silicon clusters or nanocrystals.

Structures as described herein are expected to show optical gain and are suitable for use in light emitting applications. Moreover, the semiconductor structures described can be integrated into photonic or electronic structures and can in particular be integrated with other electronic circuits onto chips.

The structures can be doped with optically active atoms, in particular of rare earth elements, either during deposition or subsequently by ion implantation.

The above-described method for the preparation of Si nanocrystals enables the control not only of the size but also of the density and the arrangements of the nanocrystals as well as and independent of the stoichiometry.

In one specific embodiment amorphous SiO$_x$/SiO$_2$ super lattices were prepared by reactive evaporation of SiO powders in an oxygen atmosphere. The films were deposited on 4 inch (10 cm) wafers in a conventional evaporation system with two symmetrically arranged evaporators. Rotation of the substrate enabled a high homogeneity over the whole wafer. Before evaporation the chamber was pumped down to $1 \times 10^{-7}$ mbar. The substrate temperature was 100° C. In this example a constant stoichiometry of $x \approx 1$ was used for the ultra thin SiO$_x$ layers. The SiO layers were prepared with thicknesses from 3 nm (sample A) to 1 nm (sample B) and with from 46 to 92 periods separated by SiO$_2$ layers of 3 nm and 2 nm to force the nanocrystals into a dense and layered arrangement. After deposition the samples were annealed at 1100° C. for one hour under an N$_2$ atmosphere.

Using dark field conditions the upper limit of the nanocrystal sizes was estimated. The roughness of the interfaces was below 0.5 nm at both sides in the prepared films and thus resulted in a size distribution of 3.3±0.5 nm after annealing for sample A.

The upper limit of the nanocrystal size estimated from dark field images are less than 3.8 nm for sample A and less than 2.0 nm for sample B. No larger crystals were observed. By X-ray diffraction the average nanocrystal size was estimated using the Scherrer equation. The average size estimated from sample A was 3.4 nm (±0.5 nm) in good agreement with the above-mentioned TEM results.

The nanocrystal sizes are controlled independently by using a layer thickness equal to or slightly below the desired crystal sizes.

Thus size control is realized by specifying the thickness of the active SiO layers, for example so they lie between 1 and 7 nm, which also limits the maximum size of the nanocrystals and strongly restricts the size distribution. The density of the nanocrystals can be adjusted by the thickness of the buffer SiO$_2$ layer. For example a thickness of approximately 3 nm is used. The position of the nanocrystal is controlled by that of the SiO layers in the growth direction and by selecting a specific area on the wafer by lithography.

This process enables the economic production of high-density arrays of randomly oriented silicon nanoclusters or nanocrystals with a narrow size distribution. It is expected that the same approach of using a superlattice structure and ultrathin Si sub oxides as the active layer can be reproduced by different techniques such as reactive sputtering, chemical wafer deposition, or molecular beam epitaxy growth and will result in a similarly simple control for ordered arranged Si nanocrystals. Within the layer the density of the nanocrystals and the thickness of the surrounding oxide buffer can be controlled by the stoichiometry of the active SiO$_x$ layer. The highest density of Si nanocrystals in this method seems to be achievable with values of x=1.

Potential applications for this technique include light emitting structures based on silicon. In addition erbium (Er) doping of the structure shows a strong enhancement of the 1.5 μm Er luminescence. This enhancement is a result of the coupled emission process of the silicon nanocrystals and Er3+ ions in the vicinity of the nanocrystal, which can be of interest for small size and low cost Er amplifiers.

What is claimed is:

1. A method of manufacturing a semiconductor structure comprising clusters and/or nanocrystals of silicon which are present in distributed form in a matrix of a silicon compound, comprising the steps of:

depositing a layer of a thermally non-stable silicon compound having a layer thickness in the range from substantially 1 nm to substantially 7 nm on a support; and thermally treating the layer at a temperature sufficient to carry out a phase separation to obtain the clusters or nanocrystals of silicon in a matrix of thermally stable silicon compound, wherein the size and size distribution of the clusters and/or nanocrystals of silicon as well as their density in said layer of silicon compound and the mean spacing between adjacent clusters and/or nanocrystals of silicon is controlled by adjusting the thickness and composition of said layer of silicon compound and wherein the clusters and/or nanocrystals are substantially coplanar and the thickness of said layer of silicon compound being such that said size distribution has a mean value of less than the layer thickness and a maximum deviation of 0.5 nm.

2. A method in accordance with claim 1, wherein said step of thermally treating the layer comprises heating the layer to a temperature at or above the crystallization temperature (Tc).

3. A method in accordance with claim 1, wherein the step of thermally treating the layer comprises rapid thermal annealing of the layer.

4. A method in accordance with claim 3, wherein the step of thermally treating the layer further comprises rapidly cooling down the layer after rapid thermal annealing of the layer.

5. A method in accordance with claim 4, wherein the step of thermally treating the layer further comprises repeating the thermal annealing and cooling of the layer.

6. A method in accordance with claim 1, further comprising the step of:
providing a support at least at an interface between the deposited layer and a layer of a material selected from a group consisting of a thermally stable silicon compound and at least one rare earth compound.

7. A method in accordance with claim 1, further comprising the step of:
depositing, on the layer, a second layer of material selected from a group consisting of a thermally stable silicon compound and at least one rare earth compound.

8. A method in accordance with claim 7, further comprising the step of:
depositing an alternating sequence of layers of thermally non-stable compounds and thermally stable silicon compounds on the layer.

9. A method in accordance with claim 8, further comprising the step of:
depositing intermediate layers between the alternating layers of deposited layers of thermally non-stable and thermally stable silicon compounds.

10. A method in accordance with claim 9, further comprising the step of:
forming a superlattice from the alternating sequence of layers.

11. A method in accordance with claim 9, wherein the alternating sequence of layers is formed in at least one spatially bounded region of the structure.

12. A method in accordance with claim 11, wherein said structure is one of a group consisting of a photonic structure and an optical structure.

13. A method in accordance with claim 12, wherein the material of the structure surrounding a region of the layers is subsequently removed to form a free standing layer sequence.

14. A method in accordance with claim 12, wherein the material of the structure surrounding a region of the layers is subsequently etched to form a free standing layer sequence.

15. A method in accordance with claim 1, wherein the semiconductor structure contains at least one compound selected from a group consisting of rare earth elements.

16. A method in accordance with claim 1, wherein the semiconductor structure contains at least one compound including an element selected from a group consisting of rare earth elements wherein said at least one element is in the vicinity of the clusters or nanocrystals.

17. A method in accordance with claim 16, wherein the at least one element is erbium and said compound is erbium oxide.

18. A method in accordance with claim 1, further comprising the step of:
doping at least one silicon compound layer with at least one compound including an element selected from a group consisting of rare earth elements.

19. A method in accordance with claim 17, wherein the at least one silicon compound layer is doped during generation of any of the layers.

20. A method in accordance with claim 1, wherein the mean size and the mean spacing of the clusters or of the nanocrystals are set via the stochiometry of the thermally non-stable compound in the layer.

21. A method in accordance with claim 20, wherein the mean size and the mean spacing of the clusters or of the nanocrystals are set by the value of x wherein the thermally non-stable compound is $SiO_x$ and wherein $0<x<2$.

22. A method in accordance with claim 1, wherein the mean size and the mean spacing of the clusters or of the nanocrystals are set by the temperature characteristic of the thermal treatment and also by the environmental conditions which are used.

23. A method in accordance with claim 22, wherein the environment during thermal treatment comprises one or more of the gases selected from the group consisting of forming gas, nitrogen, and argon.

24. A method in accordance with claim 1, wherein the structure which is produced is integrated into an electronic structure which is suitable for supplying charge carriers into the clusters or nanocrystals or to inject charge carriers into the clusters or nanocrystals.

25. A method in accordance with claim 1, wherein the deposition of the layer on a support is carried out by a process selected from a group consisting of chemical vapor deposition (CVD), low pressure chemical vapor deposition (LPCVD), evaporation of $SiO_x$ powders in oxygen-containing atmospheres, sputtering, reactive sputtering, pulsed laser deposition and molecular beam epitaxy.

26. A method in accordance with claim 1, wherein $SiO_x$ with $0<x<2$ is selected for the thermally non-stable silicon compound.

27. A method in accordance with claim 1, wherein a compound selected from the group consisting of $SiO_2$ and $Si_3N_4$ is selected as the thermally stable silicon compound.

28. A method of manufacturing a semiconductor structure comprising clusters and/or nanocrystals of silicon which are present in distributed form in a matrix of a silicon compound, comprising the steps of:
depositing a layer of a thermally non-stable silicon compound having a layer thickness in the range from substantially 1 nm to substantially 7 nm on a support; and thermally treating the layer at a temperature sufficient to carry out a phase separation to obtain the clusters or nanocrystals of silicon in a matrix of thermally stable silicon compound, wherein the size and size distribution of the clusters and/or nanocrystals of silicon as well as their density in said layer of silicon compound and the mean spacing between adjacent clusters and/or nanocrystals of silicon is controlled by adjusting the thickness and composition of said layer of silicon compound, the clusters and/or nanocrystals are substantially coplanar and the thickness of said layer of silicon compound being such that said size distribution has a mean value of 3.3 nm or less and a maximum deviation of 0.5 nm.

* * * * *